(12) United States Patent
Wang et al.

(10) Patent No.: US 10,860,517 B1
(45) Date of Patent: Dec. 8, 2020

(54) TERMINATING RESISTOR CIRCUIT OF USB PORT AND OPERATION METHOD THEREOF

(71) Applicant: VIA LABS, INC., New Taipei (TW)

(72) Inventors: Wei-Yu Wang, New Taipei (TW); Yu-Chung Wei, New Taipei (TW)

(73) Assignee: VIA LABS, INC., New Taipei (TW)

( * ) Notice: Subject to any disclaimer, the term of this patent is extended or adjusted under 35 U.S.C. 154(b) by 0 days.

(21) Appl. No.: 16/661,988

(22) Filed: Oct. 23, 2019

(30) Foreign Application Priority Data

Aug. 14, 2019 (TW) .............................. 108128826 A (51) Int. Cl.
G06F 13/40 (2006.01)
H03K 19/0185 (2006.01)
H02M 3/06 (2006.01)

(52) U.S. Cl.
CPC .......... *G06F 13/4086* (2013.01); *H02M 3/06* (2013.01); *H03K 19/018557* (2013.01)

(58) Field of Classification Search
None
See application file for complete search history.

(56) References Cited

U.S. PATENT DOCUMENTS

| 8,575,917 | B2 | 11/2013 | Sims et al. | |
|---|---|---|---|---|
| 2012/0218023 | A1* | 8/2012 | Trock | H03K 17/22 327/401 |
| 2018/0152183 | A1 | 5/2018 | Vemula | |
| 2018/0275732 | A1* | 9/2018 | Chen | G06F 1/266 |

FOREIGN PATENT DOCUMENTS

| CN | 1354560 | 6/2002 |
|---|---|---|
| CN | 107491159 | 12/2017 |
| CN | 108123687 | 6/2018 |
| CN | 108306489 | 7/2018 |
| CN | 108631377 | 10/2018 |
| EP | 3032426 | 7/2018 |
| TW | 201528651 | 7/2015 |
| TW | 201824687 | 7/2018 |

OTHER PUBLICATIONS

"Office Action of China Counterpart Application", dated May 8, 2020, p. 1-p. 9.
"Office Action of Taiwan Counterpart Application", dated May 19, 2020, p. 1-p. 5.

* cited by examiner

Primary Examiner — Jany Richardson
(74) *Attorney, Agent, or Firm* — JCIPRNET (57) ABSTRACT

A terminating resistor circuit of a USB port and an operation method thereof are provided. The terminating resistor circuit includes a terminating resistor, a terminating switch, and an energy storage control circuit. The terminating resistor and the terminating switch are connected in series between a configuration channel pin of the USB port and a first reference voltage, and the energy storage control circuit is coupled to a control end of the terminating switch. During a charging period in a configuration detection period, the energy storage control circuit stores charge from the configuration channel pin to obtain a stored electrical energy, and during a discharging period in the configuration detection period, the energy storage control circuit turns on the terminating switch by using the stored electrical energy.

24 Claims, 11 Drawing Sheets

TERMINATING RESISTOR CIRCUIT OF USB PORT AND OPERATION METHOD THEREOF

CROSS-REFERENCE TO RELATED APPLICATION

This application claims the priority benefit of Taiwan application serial no. 108128826, filed on Aug. 14, 2019. The entirety of the above-mentioned patent application is hereby incorporated by reference herein and made a part of this specification.

BACKGROUND

Field of the Invention

The invention relates to a USB port technology, and more particularly, to a terminating resistor circuit of a USB port and an operation method thereof.

Description of Related Art

Figure 1:
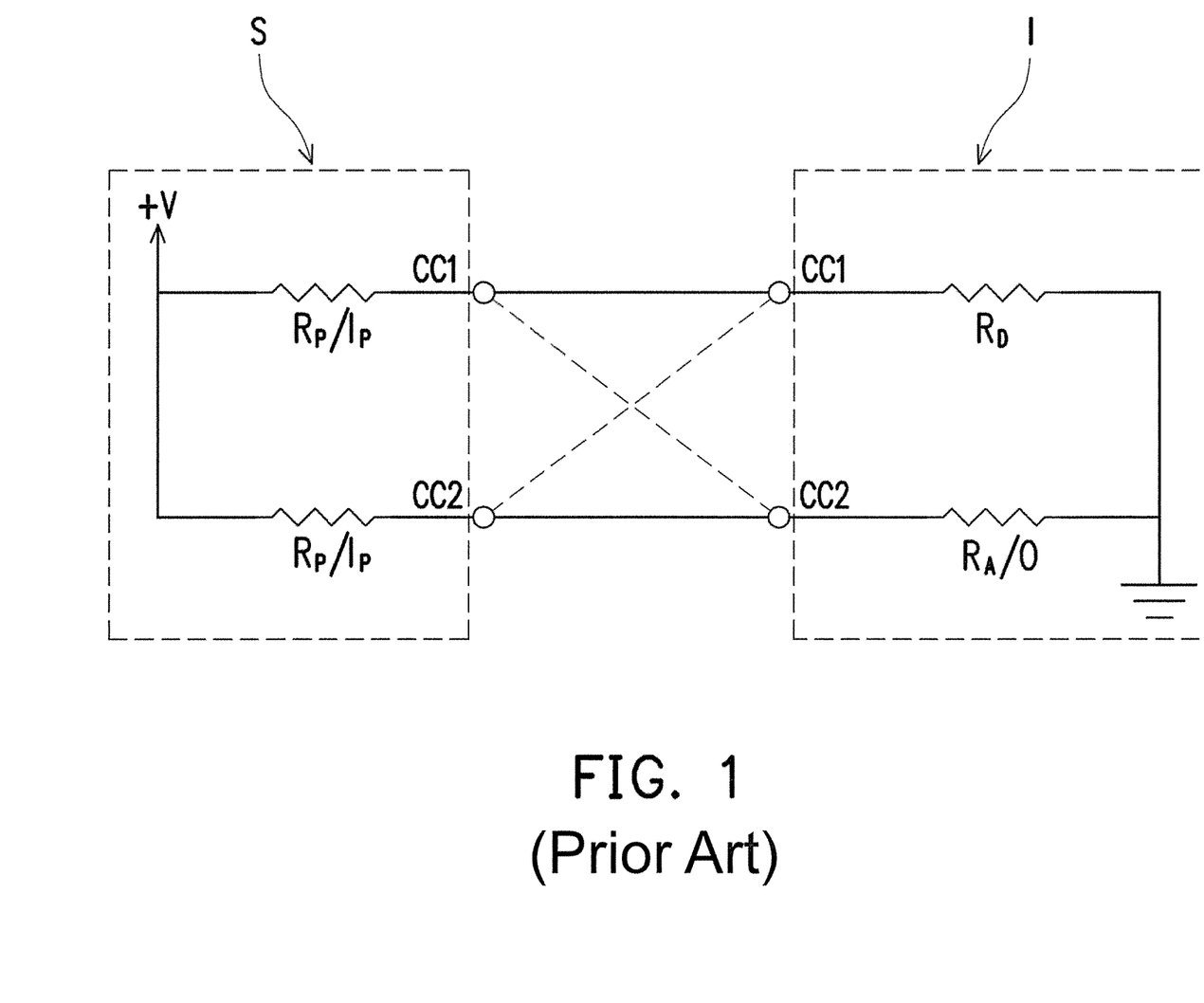
FIG. 1 shows a schematic diagram of a configuration channel module of a USB Type-C.

Hardware interface forms of a universal serial bus (USB) include Type-A, Type-B, Type-C, and the like. The new Type-C needs to determine the role of devices at both ends of a cable by monitoring voltage levels of configuration channel (CC) pins CC1 and CC2. This period is called a configuration detection period. FIG. 1 shows a schematic diagram of a configuration channel module of a USB Type-C. The configuration channel pins CC1 and CC2 of a power source terminal S are pulled up to high potential by a voltage +V through a pull-up resistor RP (terminating resistor) or a current source Ip, so that the configuration channel pins CC1 and CC2 of the power source terminal S constantly stays at high potential when nothing is connected thereto. For the power source terminal S, once the voltage levels of the configuration channel pins CC1 and CC2 are detected to be pulled to low potential, the power source terminal S determines that a power sink terminal I is connected, ends the configuration detection period, and then outputs power to the power sink terminal I. In FIG. 1, when the power sink terminal I is connected to the power source terminal S, a voltage of the configuration channel pins CC1 or CC2 is pulled to low potential by a pull-down resistor $R_D$ (terminating resistor) or $R_A$ (terminating resistor) of the power sink terminal I. In certain implementations, the pull-down resistor $R_A$ is changed to an open circuit O, i.e., the pull-down resistor $R_A$ can be removed. However, only the resistance of $R_D$ or $R_A$ is specified in USB specifications, and the manner of implementation is not specified in detail.

SUMMARY

The invention provides a terminating resistor circuit of a USB port and an operation method thereof. A terminating switch of the terminating resistor circuit is controlled and turned on during a configuration detection period by using charge of a configuration channel pin, so that the selection of the terminating switch is not limited to low-voltage elements.

A terminating resistor circuit of a USB port according to an embodiment of the invention includes a terminating resistor, a terminating switch and an energy storage control circuit. The terminating resistor and the terminating switch are connected in series between a configuration channel pin of the USB port and a first reference voltage. The energy storage control circuit is coupled to a control end of the terminating switch. During a charging period in a configuration detection period, the energy storage control circuit stores charge from the configuration channel pin to obtain a stored electrical energy. During a discharging period in the configuration detection period, the energy storage control circuit turns on the terminating switch by using the stored electrical energy.

An embodiment of the invention provides an operation method of a terminating resistor circuit of a USB port. The terminating resistor circuit includes a terminating resistor and a terminating switch. The terminating resistor and the terminating switch are connected in series between a configuration channel pin of the USB port and a first reference voltage. The operation method includes: during a charging period in a configuration detection period, storing charge from the configuration channel pin by an energy storage control circuit to obtain a stored electrical energy; and during a discharging period in the configuration detection period, turning on the terminating switch by the energy storage control circuit by using the stored electrical energy.

The terminating resistor circuit of a USB port according to an embodiment of the invention includes a terminating switch and a terminating resistor. The terminating resistor and the terminating switch are connected in series between a configuration channel pin of the USB port and a first reference voltage. During a configuration detection period, the configuration channel pin receives a detection current. During a charging period in the configuration detection period, the terminating switch is turned off, and a capacitor stores charge from the configuration channel pin to obtain a stored electrical energy such that a voltage of the configuration channel pin is pulled up during the charging period. After the charging period is ended, a discharging period in the configuration detection period is entered. During the discharging period, the terminating switch is turned on by using the stored electrical energy of the capacitor such that the voltage of the configuration channel pin is pulled down during the discharging period. After the discharging period is ended, the charging period is entered again unless the configuration detection period is ended.

An embodiment of the invention provides an operation method of a terminating resistor circuit of a USB port. The terminating resistor circuit includes a terminating resistor and a terminating switch. The terminating resistor and the terminating switch are connected in series between a configuration channel pin of the USB port and a first reference voltage. The operation method includes: during a configuration detection period, receiving a detection current by the configuration channel pin of the USB port; during a charging period in the configuration detection period, turning off the terminating switch, and storing charge from the configuration channel pin by a capacitor to obtain a stored electrical energy such that a voltage of the configuration channel pin is pulled up during the charging period; after the charging period is ended, entering a discharging period in the configuration detection period; during the discharging period, turning on the terminating switch by using the stored electrical energy of the capacitor such that the voltage of the configuration channel pin is pulled down during the discharging period; and after the discharging period is ended, entering the charging period again unless the configuration detection period is ended.

Based on the above, according to the terminating resistor circuit of a USB port and the operation method thereof of the invention, the stored electrical energy can be obtained by storing the charge of the configuration channel pin. During the configuration detection period, the energy storage control circuit can control and turn on the terminating switch by using the stored electrical energy, so that the voltage of the configuration channel pin is pulled down to low potential by the terminating resistor. The terminating switch is turned on by using the stored charge of the configuration channel pin, so that the selection of the terminating switch is not limited to low-voltage elements.

In order to make the aforementioned and other objectives and advantages of the invention comprehensible, embodiments accompanied with figures are described in detail below.

DESCRIPTION OF THE EMBODIMENTS

The following embodiments of the invention relate to terminating resistor circuits of a USB port proposed for a power sink terminal (hereinafter referred to as a sink terminal).

Figure 2:
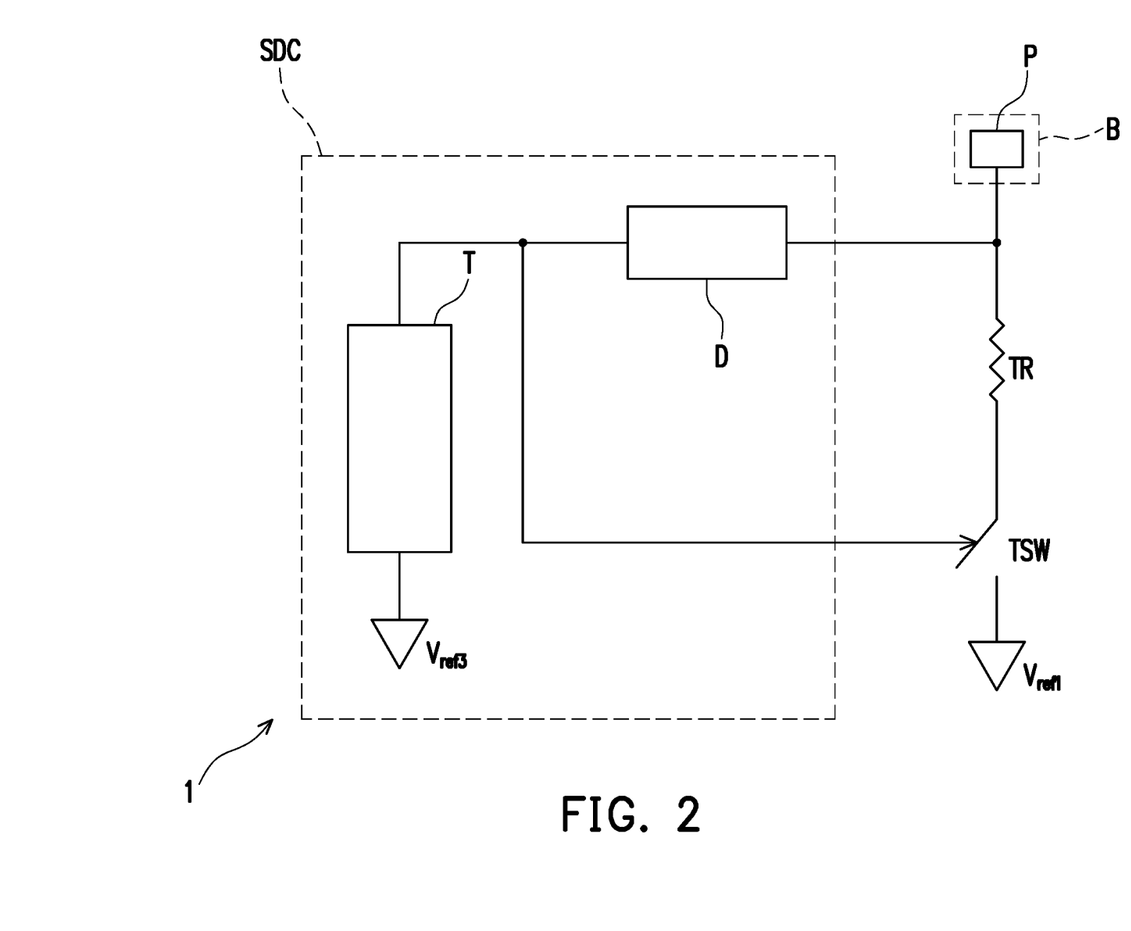
FIG. 2 shows a schematic circuit block diagram of a terminating resistor circuit of a USB port according to a first embodiment of the invention.

FIG. 2 shows a schematic circuit block diagram of a terminating resistor circuit 1 of a USB port according to a first embodiment of the invention. The terminating resistor circuit 1 includes a terminating resistor TR, a terminating switch TSW, and an energy storage control circuit SDC. A resistance of the terminating resistor TR can be determined according to the specifications of USB or determined according to design requirements. For example, the resistance of the terminating resistor TR can be 5.1 kΩ, 1 kΩ or other resistances. For the terminating resistor TR, reference can also be made to the related description of a pull-down resistor $R_D$ and a pull-down resistor $R_A$ shown in FIG. 1. The terminating resistor TR and the terminating switch TSW are connected in series between a configuration channel pin P of a USB port B and a reference voltage $V_{ref1}$. It should be noted that the USB port B actually contains a plurality of pins including the configuration channel pin P. However, FIG. 2 only shows the configuration channel pin P of the USB port B. A level of the reference voltage $V_{ref1}$ can be determined according to design requirements. For example, the reference voltage $V_{ref1}$ can be a ground voltage or other fixed voltages.

Taking the implementation of FIG. 2 as an example, a first end of the terminating resistor TR is coupled to the configuration channel pin (hereinafter referred to as CC pin) P, a second end of the terminating resistor TR is coupled to a first end of the terminating switch TSW, and a second end of the terminating switch TSW is coupled to the terminating resistor TR and the reference voltage $V_{ref1}$. According to the design requirements, a coupling order of the terminating resistor TR and the terminating switch TSW can be changed. For example, in another embodiment, the terminating switch TSW can be coupled between the CC pin P and the terminating resistor TR, and the terminating resistor TR can be coupled between the terminating switch TSW and the reference voltage $V_{ref1}$.

The terminating resistor TR can include a resistor, a voltage control resistor (such as a field-effect transistor) or other resistor elements. The terminating switch TSW can include a voltage control switch such as a metal-oxide-semiconductor field-effect transistor (MOSFET) or other switch elements. For example, the terminating switch TSW can be an N-type MOSFET (hereinafter referred to as NMOS). A drain of the NMOS is coupled to the terminating resistor TR, a source of the NMOS is coupled to the reference voltage $V_{ref1}$, and a gate of the NMOS is coupled to the energy storage control circuit SDC.

Figure 3:
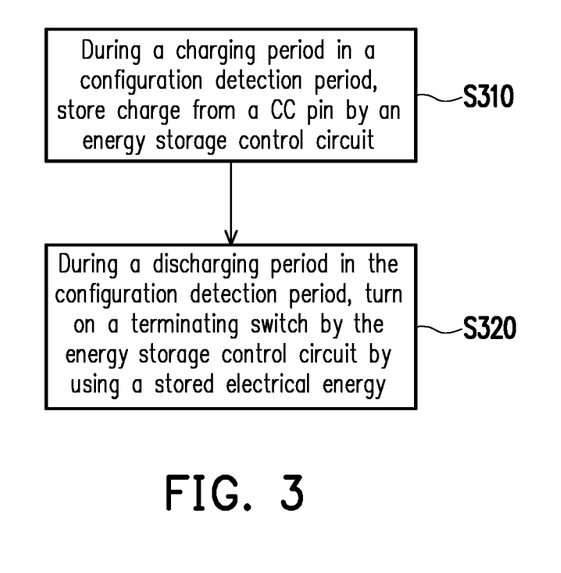
FIG. 3 shows a flowchart of an operation method of a terminating resistor circuit of a USB port according to the first embodiment of the invention.

FIG. 3 shows a flowchart of an operation method of the terminating resistor circuit 1 of the USB port according to the first embodiment of the invention. Referring to FIG. 2 and FIG. 3 together, one end of the energy storage control circuit SDC is coupled to the CC pin P to receive the charge of the CC pin P during a configuration detection period. The other end of the energy storage control circuit SDC is coupled to a control end of the terminating switch TSW to control an on/off state of the terminating switch TSW. At the beginning of the configuration detection period, the terminating switch TSW is turned off, and at this time, the charge transmitted from the outside to the CC pin P is supplied to the energy storage control circuit SDC. During a charging period in the configuration detection period (during a period in which the terminating switch TSW is turned off), the energy storage control circuit SDC stores the charge from the CC pin P to obtain a stored electrical energy (step S310). As the charge is accumulated, a voltage level of the stored electrical energy gradually increases. During a discharging period in the configuration detection period, the energy storage control circuit SDC turns on the terminating switch TSW by using the stored electrical energy (step S320) to provide a configuration detection for the terminating resistor TR.

An external device (not shown, for example, a power source device) electrically connected to the USB port B can detect a voltage level of the CC pin P to determine whether a power sink device is connected. When the external device detects that the voltage level of the CC pin P is pulled to low potential, the external device determines that the power sink device is connected to the other end of the USB port B to thereby complete the configuration detection. After the configuration detection is completed, the configuration detection period is ended and a non-configuration detection period is entered. After the configuration detection period is ended, the external device can output power to the power sink device having the terminating resistor circuit 1 according to a result of the configuration detection.

For example, FIG. 2 illustrates one of multiple implementation examples of the energy storage control circuit SDC. The energy storage control circuit SDC can include an energy storage element T and a control element D. The energy storage element T (for example, a capacitor or other electrical energy storage elements) can store the charge from the CC pin P. One end of the control element D (for example, a diode element, a switch, and/or other elements) is coupled to the CC pin P and one end of the terminating resistor TR. The other end of the control element D is coupled to one end of the energy storage element T and the control end of the terminating switch TSW. In an embodiment in which the control element D includes the diode element, an anode of the diode element is coupled to the CC pin P and one end of the terminating resistor TR, and a cathode of the diode element is coupled to one end of the energy storage element T and the control end of the terminating switch TSW.

At the beginning of the configuration detection period, the terminating switch TSW is turned off, and a detection current from the CC pin P can charge the energy storage element T through the control element D. Therefore, a voltage of the CC pin P and a voltage of the energy storage element T are pulled up during the charging period. The electrical energy (voltage) stored by the energy storage element T can be transmitted to a control terminal of the terminating switch TSW. After the stored electrical energy of the energy storage element T reaches a certain extent (for example, the voltage level of the stored electrical energy is greater than a threshold voltage of the terminating switch TSW), the terminating switch TSW is turned on to enter the discharging period in the configuration detection period. After the terminating switch TSW is turned on (during the discharging period), the control element D is turned off, and the voltage of the CC pin P is pulled down to low potential by the terminating resistor TR and the reference voltage $V_{ref1}$. During a period in which the terminating switch TSW is turned on, the power source terminal (hereinafter referred to as a source terminal) can detect the voltage of the CC pin P.

The energy storage control circuit SDC can control and turn on the terminating switch TSW by using the stored electrical energy of the energy storage element T such that the voltage of the CC pin P is pulled down to low potential by the terminating resistor TR. The terminating switch TSW is turned on by using the charge transmitted by the CC pin P, so that the selection of the terminating switch is not limited to the low-voltage elements. For example, a general transistor (a transistor with a high threshold voltage) can also be used to implement the terminating switch TSW.

Figure 4:
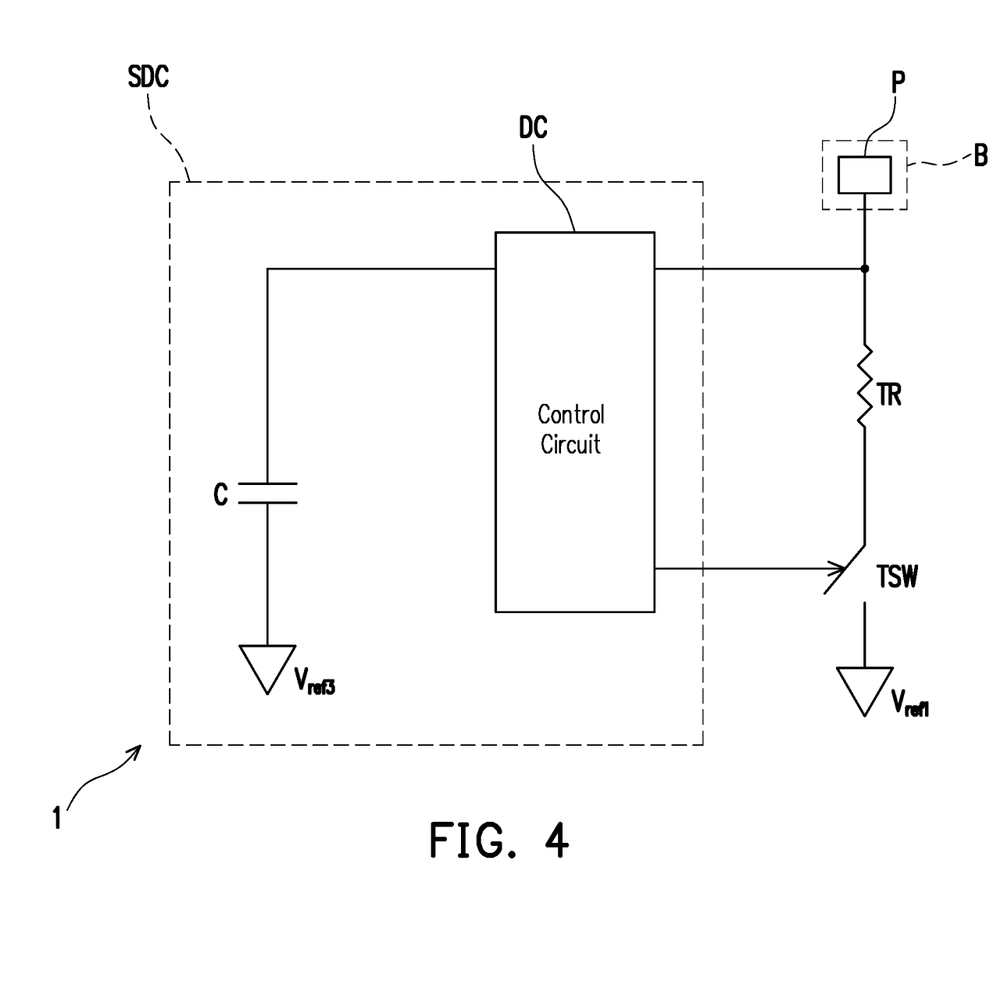
FIG. 4 shows a schematic circuit block diagram of a terminating resistor circuit of a USB port according to a second embodiment of the invention.

FIG. 4 shows a schematic circuit block diagram of the terminating resistor circuit 1 of the USB port according to a second embodiment of the invention. The energy storage control circuit SDC shown in FIG. 4 can include a capacitor C and a control circuit DC. Two ends of the capacitor C are respectively coupled to the control circuit DC and a reference voltage $V_{ref3}$. A level of the reference voltage $V_{ref3}$ can be determined according to design requirements. For example, the reference voltage $Vr_{ref3}$ can be a ground voltage or other fixed voltages. In certain embodiments, the level of the reference voltage $V_{ref3}$ can be the same as the level of the reference voltage $V_{ref1}$. In other embodiments, the level of the reference voltage $V_{ref3}$ can be different from the level of the reference voltage $V_{ref1}$.

The control circuit DC is also coupled to the control end of the terminating switch TSW to control the on/off state of the terminating switch TSW. The control circuit DC is also coupled to the CC pin P to receive the charge. According to design requirements, the control circuit DC can include a comparator, a switch element, and/or other elements. In another embodiment, the control circuit DC can include a control chip, a microcontroller, or other control circuits.

Figure 5:
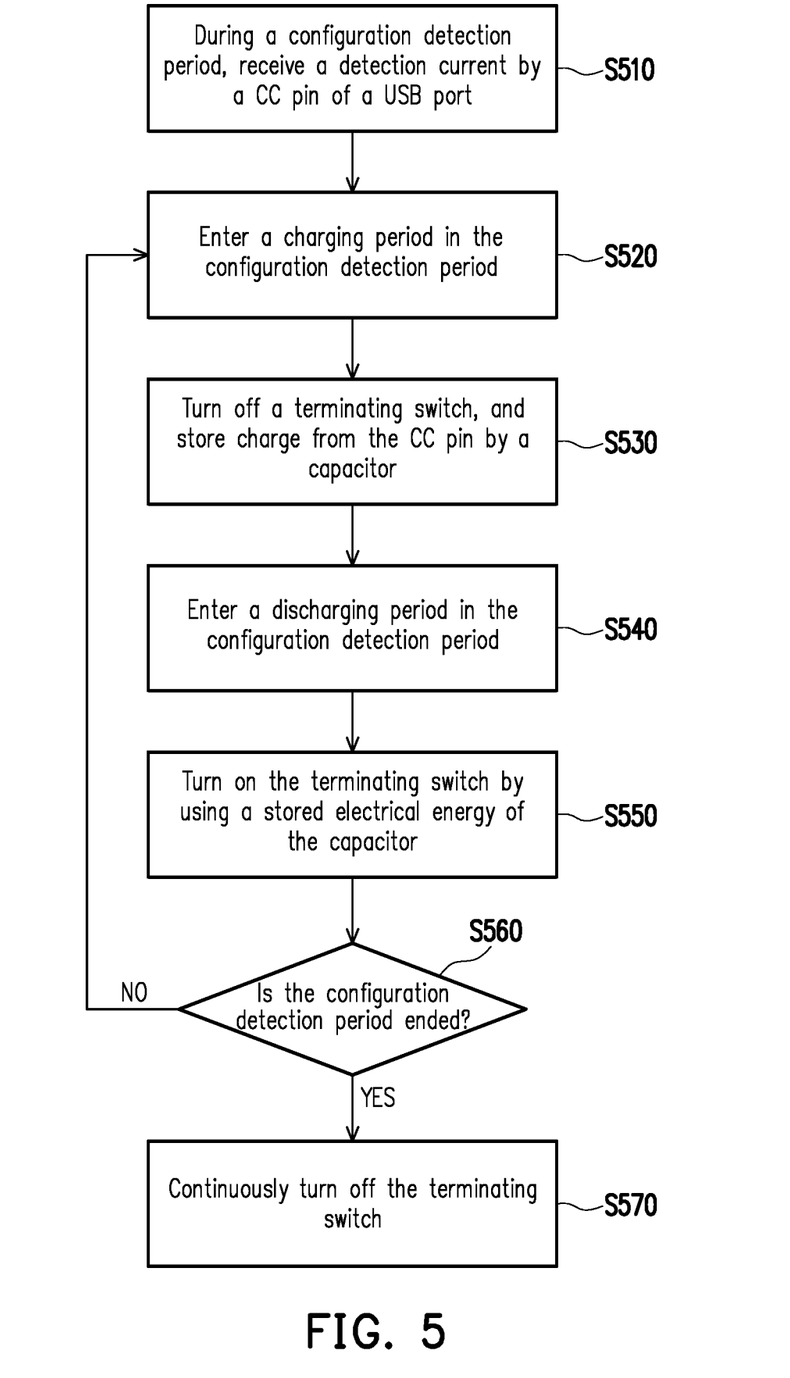
FIG. 5 shows a flowchart of an operation method of a terminating resistor circuit of a USB port according to the second embodiment of the invention.

FIG. 5 shows a flowchart of an operation method of the terminating resistor circuit 1 of the USB port according to the second embodiment of the invention. Referring to FIG. 4 and FIG. 5 together, at the beginning of the configuration detection period, the CC pin P receives a detection current (step S510). When an external device (not shown, for example, the power source device) is electrically connected to the CC pin P, the detection current is supplied by the external device. When a test platform (not shown, or a test fixture) is electrically connected to the CC pin P, the detection current can be supplied by the test platform (or the test fixture). During a charging period in the configuration detection period (step S520), the control circuit DC turns off the terminating switch TSW and transmits charge from the CC pin P to the capacitor C (step S530). Therefore, the detection current from the CC pin P can charge the capacitor C in step S530 such that a voltage of the capacitor C is pulled up during the charging period.

The control circuit DC can detect the stored electrical energy accumulated in the capacitor C by, for example, detecting the voltage of the capacitor C. As the charge is accumulated, the voltage level of the stored electrical energy gradually increases. When the stored electrical energy stored in the capacitor C reaches a certain extent (for example, the voltage level of the stored electrical energy is greater than the threshold voltage of the terminating switch TSW), the control circuit DC can end the charging period and enter the discharging period (step S540). During the discharging period, the control circuit DC can turn on the terminating switch TSW by using the stored electrical energy stored in the capacitor C (step S550).

In general, the amount of charge (or the amount of current, or the magnitude of power) transmitted by the CC pin P is small, and the terminating resistance of the USB specifications is not large. In order to directly turn on the terminating switch TSW by directly using the charge transmitted by the CC pin P, the selection of the terminating switch TSW needs to be limited to the low-voltage elements. Since the control circuit DC can use the stored electrical energy of the capacitor C to reach a higher potential to turn on the terminating switch TSW, the selection of the terminating switch TSW is not limited to the low-voltage elements. For example, a general transistor (a transistor with a high threshold voltage) or a high-voltage-resistant transistor can also be used to implement the terminating switch TSW.

An external device (not shown, for example, the power source device) electrically connected to the USB port B detects the voltage level of the CC pin P. When the terminating switch TSW is turned on, the voltage of the CC pin P is pulled down to low potential. When the external device detects that the voltage level of the CC pin P is pulled to low potential, the external device determines that the external device is connected to a power sink device through the USB port B to thereby complete the configuration detection.

Because of the leakage of an actual circuit, during the discharging period, the voltage of the stored electrical energy of the capacitor C gradually decreases. When the voltage of the capacitor C decreases below the threshold voltage of the terminating switch TSW, the stored electrical energy of the capacitor C is insufficient to turn on the terminating switch TSW (i.e., the terminating switch TSW returns to the off state). In general, the external device (not shown, for example, the power source device) can complete the configuration detection during one turned-on period of the terminating switch TSW. After the configuration detection is completed, the external device can start supplying power to the power sink device having the terminating resistor circuit 1, so that the configuration detection period can be ended. The control circuit DC can determine whether the configuration detection period is ended (step S560). If the configuration detection period is already ended, the control circuit DC can continuously turn off the terminating switch TSW (step S570) until the external device is removed.

When the configuration detection period is not ended, if the external device has not complete the configuration detection during the one turned-on period of the terminating switch TSW, the control circuit DC can end the discharging period and enter the charging period again (return to step S520). After the discharging period, the control circuit DC can turn off the terminating switch TSW to enter the charging period again. When the stored electrical energy stored in the capacitor C reaches a certain extent (for example, the voltage level of the stored electrical energy is greater than the threshold voltage of the terminating switch TSW), the control circuit DC can end the charging period and enter the discharging period again (return to step S540 and step S550) so as to turn on the terminating switch TSW again. The above process continues unless the configuration detection period is ended. That is, "charging", "discharging", "charging", "discharging" . . . are repeatedly performed until the external device (not shown, for example, the power source device) completes the configuration detection, or the configuration detection period exceeds a rated time. If the configuration detection period exceeds the rated time, the configuration detection period is ended.

Figure 6:
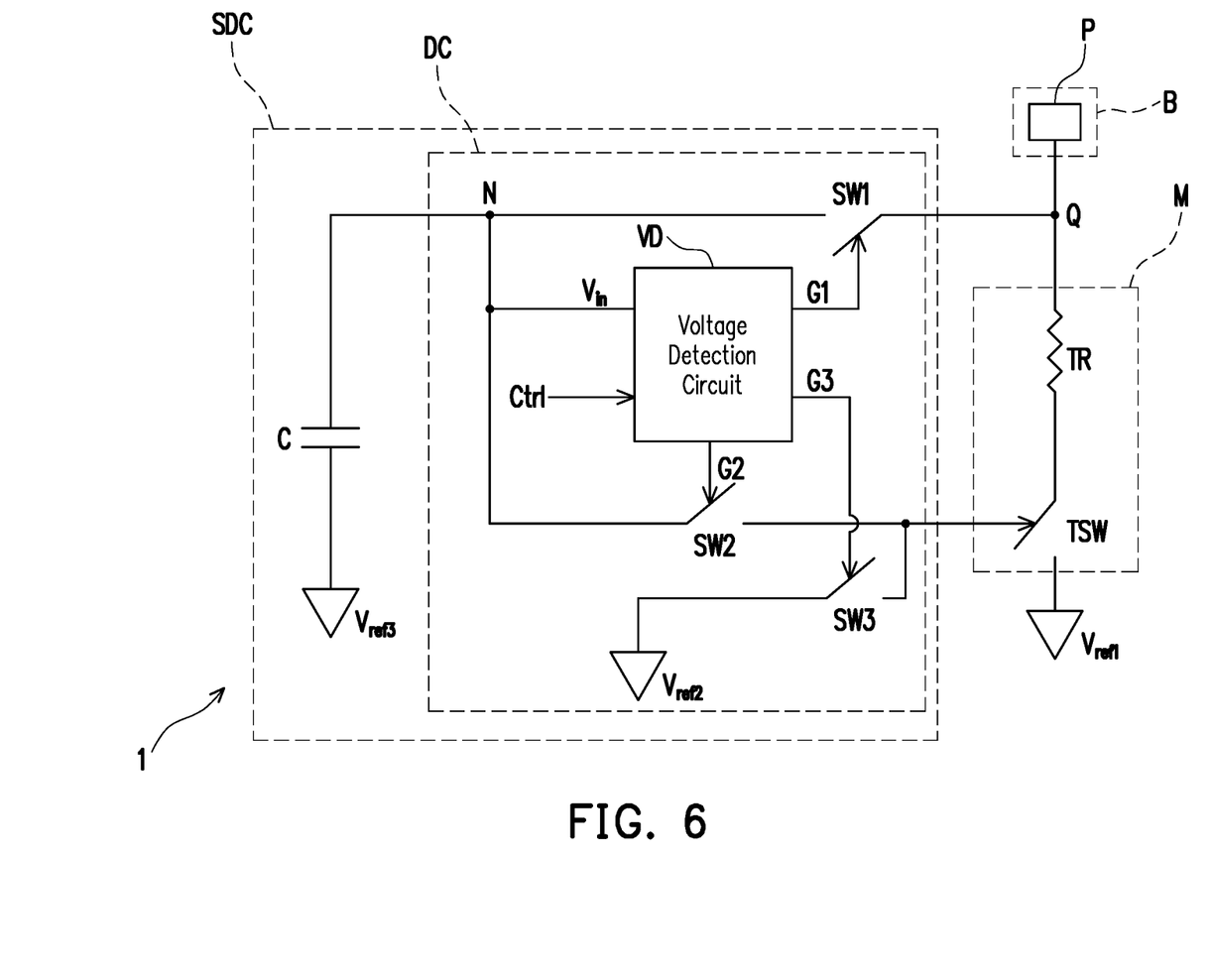
FIG. 6 shows a schematic circuit block diagram of a terminating resistor circuit of a USB port according to a third embodiment of the invention.

FIG. 6 shows a schematic circuit block diagram of the terminating resistor circuit 1 of the USB port according to a third embodiment of the invention. Referring to FIG. 6, the terminating resistor circuit 1 includes the terminating resistor TR, the terminating switch TSW, and the energy storage control circuit SDC. The energy storage control circuit SDC, the terminating resistor TR, and the terminating switch TSW of FIG. 6 can be analogized with reference to the related description of the energy storage control circuit SDC, the terminating resistor TR, and the terminating switch TSW of FIG. 2 or FIG. 4, which is not repeated herein. For the operation of the energy storage control circuit SDC shown in FIG. 6, reference can be made to the related description of FIG. 3.

Referring to FIG. 6, the energy storage control circuit SDC includes the capacitor C and the control circuit DC. The capacitor C and the control circuit DC shown in FIG. 6 can be analogized with reference to the related description of the capacitor C and the control circuit DC shown in FIG. 4, which is not repeated herein. For the operation of the control circuit DC shown in FIG. 6, reference can be made to the related description of FIG. 5. In the embodiment shown in FIG. 6, the control circuit DC includes a first switch SW1, a voltage detection circuit VD, a second switch SW2, and a third switch SW3. The first switch SW1, the second switch SW2, and/or the third switch SW3 can be an MOSFET or other voltage control switches. In one embodiment, the first switch SW1 can be a diode. The following description is made below with the first switch SW1 being the MOSFET.

A first end of the first switch SW1 is coupled to the CC pin P, and a second end of the first switch SW1 is coupled to a first end of the capacitor C. A second end of the capacitor C is coupled to the reference voltage $V_{ref3}$. A first end of the second switch SW2 is coupled to the capacitor C. A second end of the second switch SW2 is coupled to a control end of the terminating switch TSW. A first end of the third switch SW3 is coupled to a reference voltage $V_{ref2}$. A second end of the third switch SW3 is coupled to the control end of the terminating switch TSW. A level of the reference voltage $V_{ref2}$ can be determined according to design requirements. For example, the reference voltage $V_{ref2}$ can be a ground voltage or other fixed voltages. In certain embodiments, the level of the reference voltage $V_{ref2}$ can be the same as the level of the reference voltage $V_{ref1}$ and/or the reference voltage $V_{ref3}$. In other embodiments, the level of the reference voltage $V_{ref2}$ can be different from the level of the reference voltage $V_{ref1}$ and/or the reference voltage $V_{ref3}$.

An input terminal $V_{in}$ of the voltage detection circuit VD is coupled to the first end of the capacitor C to detect the stored electrical energy of the capacitor C. In addition, three output terminals G1, G2, and G3 of the voltage detection circuit VD are respectively coupled to the control end of the first switch SW1, the control end of the second switch SW2, and the control end of the third switch SW3 to control on/off states of the first switch SW1, the second switch SW2, and the third switch SW3. The voltage detection circuit VD is provided with a first threshold and a second threshold. The first threshold and the second threshold can be determined according to design requirements. In certain embodiments, the first threshold is greater than the second threshold.

The voltage detection circuit VD can include a comparator and/or a logic gate. The voltage detection circuit VD can compare the voltage of the capacitor C, the first threshold, and the second threshold. When the voltage of the capacitor C (i.e., a voltage of a node N) is greater than the first threshold (i.e., during the discharging period), the voltage detection circuit VD turns off the first switch SW1 and the third switch SW3, and turns on the second switch SW2. During a period in which the second switch SW2 is turned on, the stored electrical energy stored in the capacitor C can turn on the terminating switch TSW through the second switch SW2. When the voltage of the capacitor C is less than the second threshold (i.e., during the charging period), the voltage detection circuit VD turns on the first switch SW1 and the third switch SW3, and turns off the second switch SW2. During a period in which the first switch SW1 is turned on, the charge from the CC pin P can charge the capacitor C through the first switch SW1. When the third switch SW3 is turned on, the potential of the control end of the terminating switch TSW is pulled down by the reference voltage $V_{ref2}$ such that the terminating switch TSW is turned off.

More specifically, during the configuration detection period, the external device (not shown, for example, the power source device) supplies the detection current to the CC pin P. During the charging period, the detection current of the CC pin P charges the capacitor C through the first switch SW1 (at this time, the terminating switch TSW is not turned on). For the CC pin P, since the terminating switch TSW is an open circuit, a terminating resistor circuit M including the terminating resistor TR and the terminating switch TSW is in a high impedance state. When the voltage of the capacitor C (i.e., the voltage of the node N) is greater than the first threshold, the voltage detection circuit VD turns off the first switch SW1 and the third switch SW3, and at the same time, turns on the second switch SW2. At this time, the voltage of the capacitor C is transmitted to the control end of the terminating switch TSW through the second switch SW2 to turn on the terminating switch TSW. At this time, the terminating resistor circuit M including the terminating resistor TR and the terminating switch TSW is in a low impedance state, so that the voltage of the CC pin P is pulled down to low potential by the terminating resistor circuit M and the reference voltage $V_{refl}$.

Because of the leakage of the actual circuit, the voltage of the capacitor C (that is, the voltage of the node N) gradually decreases during the discharging period. When the voltage detection circuit VD detects that the voltage of the capacitor C is less than the second threshold, the voltage detection circuit VD turns on the first switch SW1 and the third switch SW3 and turns off the second switch SW2, that is, turns on a charging path again and ends the discharging period.

Figure 7:
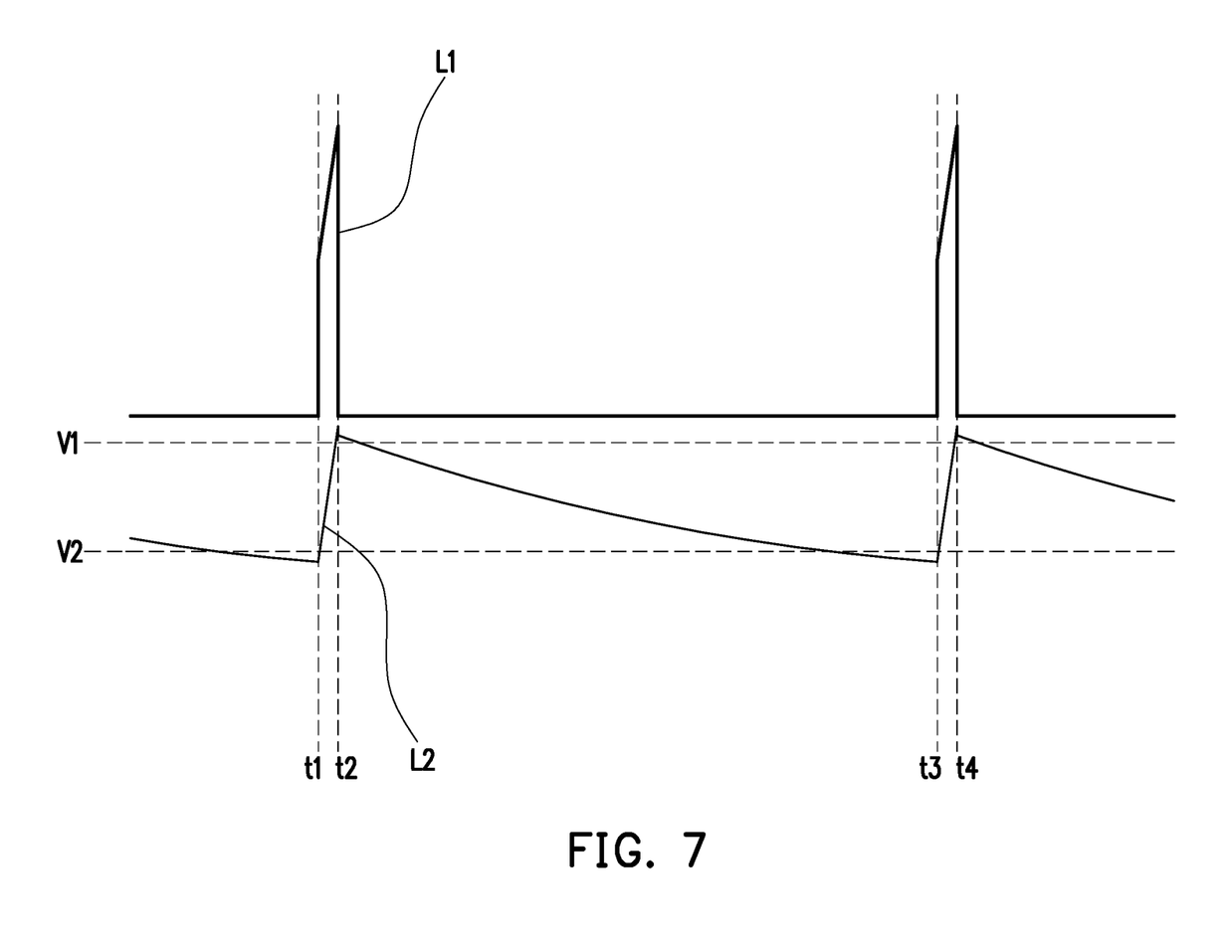
FIG. 7 shows a schematic diagram of a voltage waveform of a CC pin and a voltage waveform of a capacitor C of FIG. 6.

FIG. 7 shows a schematic diagram of a voltage waveform of the CC pin P and a voltage waveform of the capacitor C of FIG. 6. In FIG. 7, a horizontal axis represents time and a vertical axis represents the voltage level. A voltage waveform curve L1 shown in FIG. 7 represents a voltage waveform of a node Q of FIG. 6, that is, the voltage waveform of the CC pin P. A voltage waveform curve L2 shown in FIG. 7 represents a voltage waveform of the node N of FIG. 6, that is, the voltage waveform of the capacitor C. Referring to FIG. 6 and FIG. 7 together, a period from a time point t1 to a time point t2 is the charging period. When the voltage of the capacitor C (the voltage waveform curve L2) exceeds a first threshold V1, the charging period is ended, and the terminating switch TSW is turned on such that the voltage of the CC pin P (the voltage waveform curve L1) is pulled down from high potential to low potential.

A period from the time point t2 to a time point t3 is the discharging period. Due to the leakage of the actual circuit, the voltage of the capacitor C (the voltage waveform curve L2) gradually decreases during the discharging period. The terminating switch TSW remains turned on during the discharging period, so that the voltage of the CC pin P (the voltage waveform curve L1) is kept at low potential during the discharging period. At the time point t3, since the voltage of the capacitor C (the voltage waveform curve L2) is less than a second threshold V2, the discharging period is ended and the charging period is entered again. A period from the time point t3 to a time point t4 is the charging period. During the charging period, the voltage of the CC pin P (the voltage waveform curve L1) returns to high potential. At the time point t4, since the voltage of the capacitor C (the voltage waveform curve L2) is higher than the first threshold V1 again, the charging period is ended, and the voltage of the CC pin P (the voltage waveform curve L1) is pulled down to low potential again. The above charging and discharging processes are repeated continuously unless the configuration detection period is ended and the non-configuration detection period is entered.

With continued reference to FIG. 6, the voltage detection circuit VD (the energy storage control circuit SDC) is controlled by a control signal Ctrl. When the control signal Ctrl indicates the configuration detection period, the control signal Ctrl can enable the voltage detection circuit VD. When the control signal Ctrl indicates the non-configuration detection period, the control signal Ctrl can disable the voltage detection circuit VD, that is, the energy storage control circuit SDC can turn off the terminating switch TSW. In detail, during a period in which the voltage detection circuit VD is disabled, the voltage detection circuit VD continuously turns on the first switch SW1 and the third switch SW3 and continuously turns off the second switch SW2. Therefore, the terminating switch TSW can be continuously turned off during the non-configuration detection period. That is, during the non-configuration detection period, a repetitive oscillation state shown in FIG. 7 is terminated. It should be specially noted that since the terminating switch TSW is continuously turned off, the power consumption of the terminating resistor TR can be effectively reduced during the non-configuration detection period.

Figure 8:
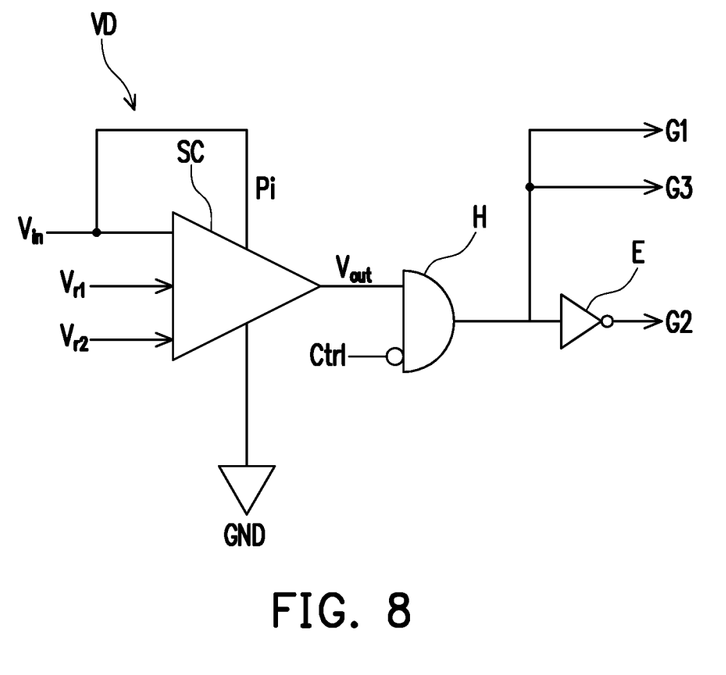
FIG. 8 shows a schematic diagram showing the implementation of a voltage detection circuit of FIG. 6.

FIG. 8 is a schematic circuit block diagram showing the voltage detection circuit of FIG. 6 according to an embodiment of the invention. Referring to FIG. 8, the voltage detection circuit VD includes a dual threshold comparator SC, a NIMPLY gate H, and a NOT gate E. An input terminal of the dual threshold comparator SC is coupled to the input terminal $V_{in}$ of the voltage detection circuit VD. A power terminal Pi of the dual threshold comparator SC is also coupled to the input terminal $V_{in}$ of the voltage detection circuit VD. A ground terminal of the dual threshold comparator SC is coupled to a reference voltage (for example, a ground voltage GND). Reference voltage terminals $V_{r1}$ and $V_{r2}$ of the dual threshold comparator SC respectively receive the first threshold V1 and the second threshold V2. According to design requirements, in another embodiment, the dual threshold comparator SC can include a Schmitt trigger.

The stored electrical energy of the capacitor C can supply power to the dual threshold comparator SC. During the charging period, a voltage of the input terminal $V_{in}$ is less than a voltage of the reference voltage terminal $V_{r1}$ (the first threshold V1), so an output terminal $V_{out}$ of the dual threshold comparator SC outputs logic 0. When the voltage of the input terminal $V_{in}$ is greater than the first threshold V1, the charging period is ended and the discharging period is entered. During the discharging period, the voltage of the input terminal $V_{in}$ is greater than a voltage of the reference voltage terminal $V_{r2}$ (the second threshold V2), so the output terminal $V_{out}$ the dual threshold comparator SC outputs logic 1. When the voltage of the input terminal $V_{in}$ is less than the second threshold V2, the discharging period is ended and the charging period is entered again.

A non-inverting input terminal of the NIMPLY gate H is coupled to the output terminal $V_{out}$ f the dual threshold comparator SC. An inverting input terminal of the NIMPLY gate H receives the control signal Ctrl. When the control signal Ctrl is logic 1, the NIMPLY gate H does not transmit a signal of the output terminal $V_{out}$ f the dual threshold comparator SC to an output terminal of the NIMPLY gate H, which is equivalent to the voltage detection circuit VD (the energy storage control circuit SDC) being disabled. When the control signal Ctrl is logic 0, the NIMPLY gate H transmits the signal of the output terminal $V_{out}$ f the dual threshold comparator SC to the output terminal of the NIMPLY gate H, which is equivalent to the voltage detection circuit VD (the energy storage control circuit SDC) being enabled. The output terminal of the NIMPLY gate H is coupled to the output terminals G1 and G3 of the voltage detection circuit VD so as to control the first switch SW1 and the third switch SW3. An input terminal of the NOT gate E is coupled to the output terminal of the NIMPLY gate H. An output terminal of the NOT gate E is coupled to the output terminal G2 of the voltage detection circuit VD so as to control the second switch SW2.

Figure 9:
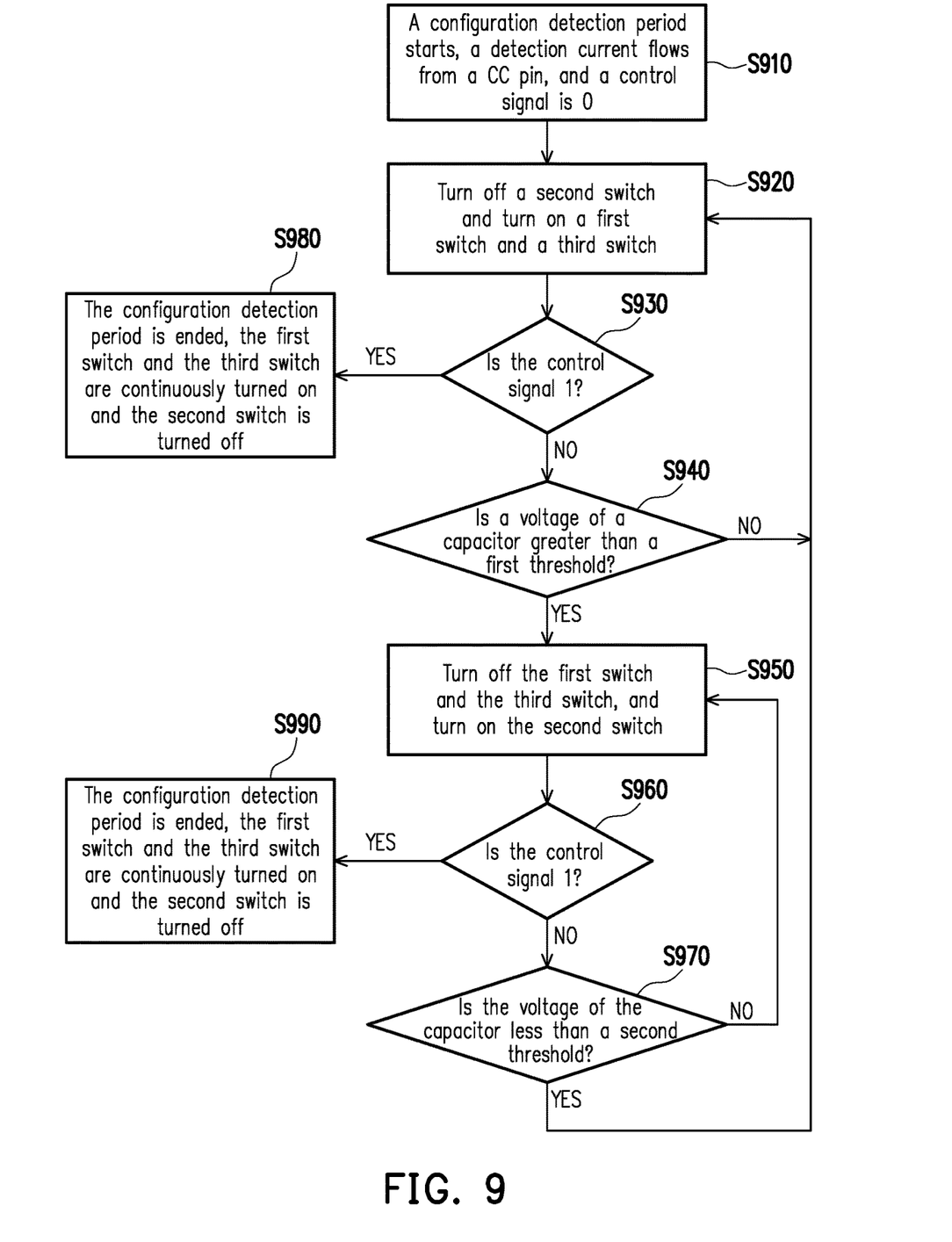
FIG. 9 shows a flowchart of an operation method of a terminating resistor circuit of a USB port according to the third embodiment of the invention.

FIG. 9 shows a flowchart of an operation method of the terminating resistor circuit 1 of the USB port according to the third embodiment of the invention. Referring to FIG. 6 and FIG. 9 together, firstly, the configuration detection period starts, and the external device (not shown, for example, the power source device) supplies the detection current to the CC pin P (step S910). At this time, the control signal Ctrl is in an initial state (for example, logic 0), and the voltage detection circuit VD turns on the first switch SW1 and the third switch SW3 and turns off the second switch SW2 (step S920). The voltage detection circuit VD continues to detect the voltage of the capacitor C under the condition that the control signal Ctrl is still 0. In step S930, whether the control signal Ctrl is logic 1 is determined. When the control signal Ctrl is logic 0 ("NO" in step S930), step S940 is performed. In step S940, whether the voltage of the capacitor C is greater than the first threshold V1 is determined. When the voltage of the capacitor C is less than the first threshold V1 ("NO" in step S940), step S920 and step S930 are performed again.

When the voltage of the capacitor C is greater than the first threshold V1 ("YES" in step S940), the charging period is ended and the discharging period is entered. During the discharging period, the voltage detection circuit VD turns off the first switch SW1 and the third switch SW3, and turns on the second switch SW2 (step S950). After step S950, step S960 is performed. In step S960, whether the control signal Ctrl is logic 1 is determined. When the control signal Ctrl is logic 0 ("NO" in step S960), step S970 is performed. In step S970, whether the voltage of the capacitor C is less than the second threshold V2 is determined. When the voltage of the capacitor C is greater than the second threshold V2 ("NO" in step S970), step S950 and step S960 are performed again. When it is determined in step S970 that the voltage of the capacitor C is less than the second threshold V2 ("YES" in step S970), step S920 and step S930 are performed again.

It should be specially noted that in any state, if the control signal Ctrl turns to 1 (indicating that the configuration detection period is ended), the voltage detection circuit VD is disabled. The disabled voltage detection circuit VD continuously turns on the first switch SW1 and the third switch SW3, and continuously turns off the second switch SW2. For example, when a determination result in step S930 is "YES" (the control signal Ctrl is logic 1), the voltage detection circuit VD continuously turns on the first switch SW1 and the third switch SW3, and continuously turns off the second switch SW2 (step S980). Similarly, when a determination result in step S960 is "YES" (the control signal Ctrl is logic 1), the voltage detection circuit VD also continuously turns on the first switch SW1 and the third switch SW3, and continuously turns off the second switch SW2 (step S990).

Figure 10:
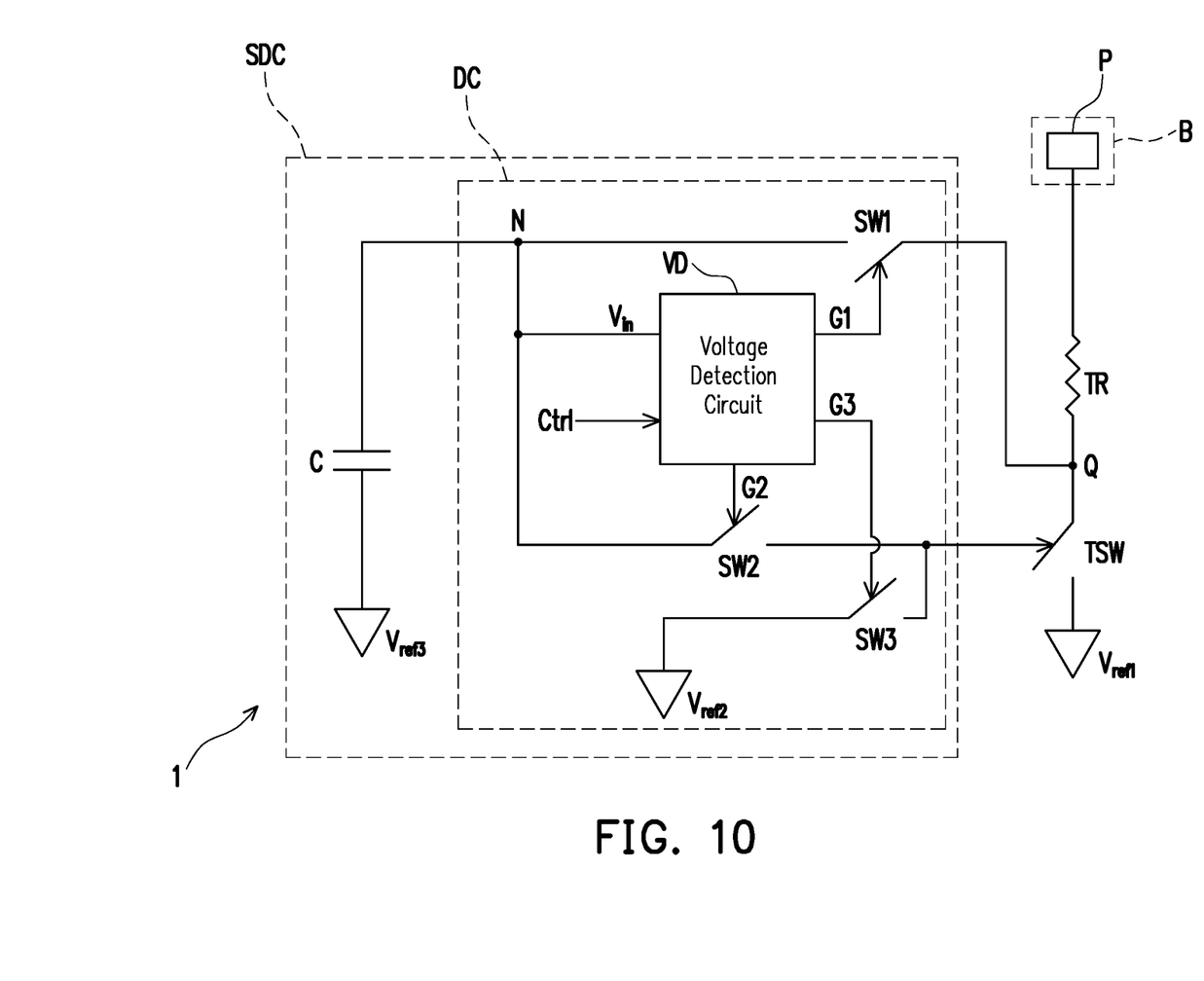
FIG. 10 shows a schematic circuit block diagram of a terminating resistor circuit of a USB port according to a fourth embodiment of the invention.

FIG. 10 shows a schematic circuit block diagram of the terminating resistor circuit 1 of the USB port according to a fourth embodiment of the invention. The terminating resistor circuit 1 shown in FIG. 10 includes the terminating resistor TR, the terminating switch TSW, and the energy storage control circuit SDC. The energy storage control circuit SDC, the terminating resistor TR, and the terminating switch TSW shown in FIG. 10 can be analogized with reference to the related description of the energy storage control circuit SDC, the terminating resistor TR, and the terminating switch TSW shown in FIG. 2, FIG. 4 or FIG. 6, which is not repeated herein. For the operation of the energy storage control circuit SDC shown in FIG. 10, reference can be made to the related description of FIG. 3. The energy storage control circuit SDC shown in FIG. 10 includes the capacitor C and the control circuit DC. The capacitor C and the control circuit DC shown in FIG. 10 can be analogized with reference to the related description of the capacitor C and the control circuit DC shown in FIG. 4 or FIG. 6, which is not repeated herein. For the operation of the control circuit DC shown in FIG. 10, reference can be made to the related description of FIG. 5.

The control circuit DC shown in FIG. 10 includes the first switch SW1, the second switch SW2, the third switch SW3, and the voltage detection circuit VD. In the embodiment shown in FIG. 10, one end of the first switch SW1 is coupled between the terminating resistor TR and the terminating switch TSW. That is, the energy storage control circuit SDC is coupled to the CC pin P via the terminating resistor TR to receive and store the charge of the CC pin P. The first switch SW1, the second switch SW2, the third switch SW3, and the voltage detection circuit VD shown in FIG. 10 can be analogized with reference to the related description of the first switch SW1, the second switch SW2, the third switch SW3, and the voltage detection circuit VD shown in FIG. 6, which is not repeated herein. For the voltage detection circuit VD shown in FIG. 10, reference can be made to the related description of FIG. 7, FIG. 8 and/or FIG. 9.

Figure 11:
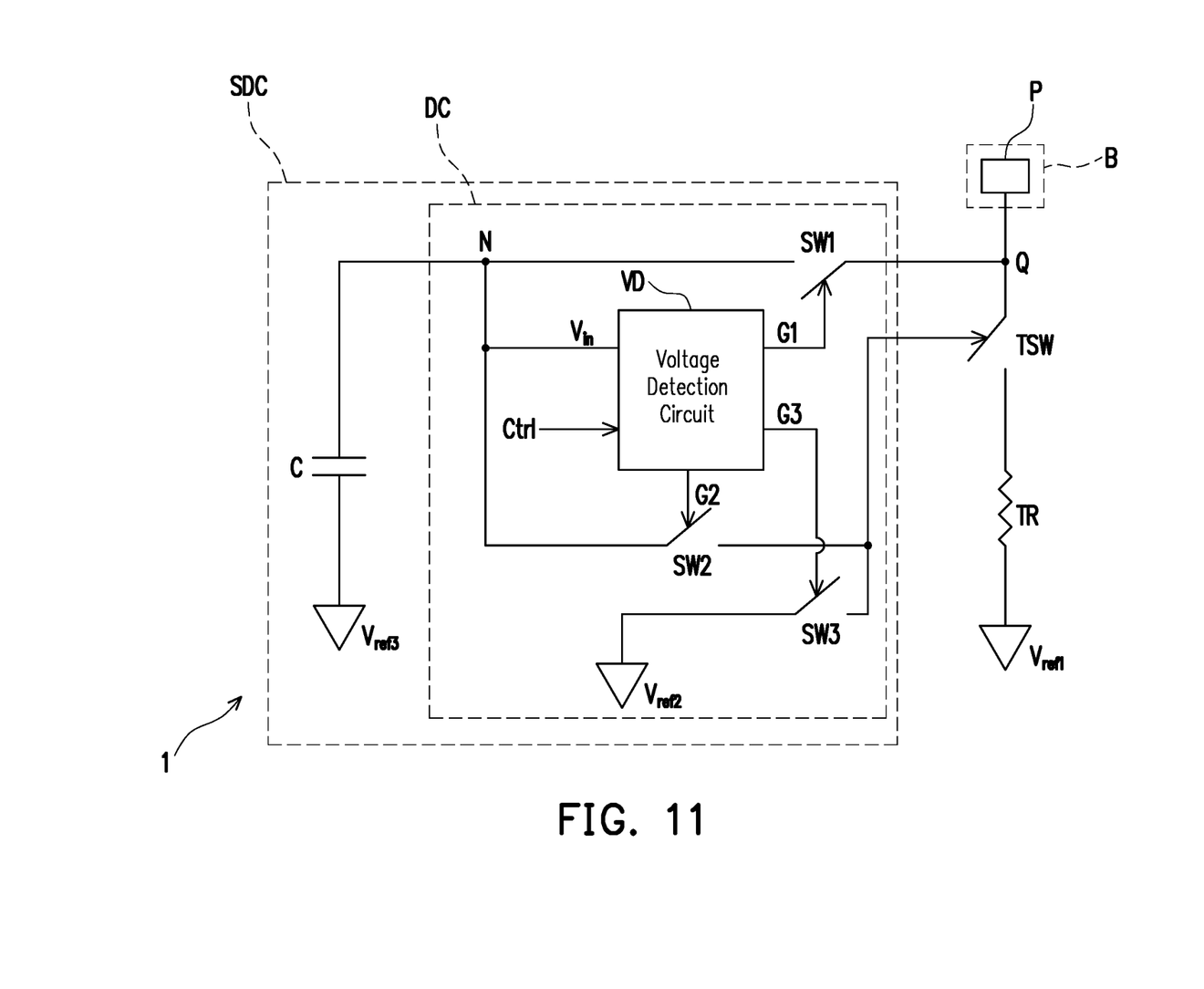
FIG. 11 shows a schematic circuit block diagram of a terminating resistor circuit of a USB port according to a fifth embodiment of the invention.

FIG. 11 shows a schematic circuit block diagram of the terminating resistor circuit 1 of the USB port according to a fifth embodiment of the invention. The terminating resistor circuit 1 shown in FIG. 11 includes the terminating resistor TR, the terminating switch TSW, and the energy storage control circuit SDC. In the embodiment shown in FIG. 11, the first end of the terminating switch TSW is coupled to the CC pin P, the second end of the terminating switch TSW is coupled to the first end of the terminating resistor TR, and the second end of the terminating resistor TR is coupled to the reference voltage $V_{ref1}$. That is, the terminating switch TSW is coupled between the CC pin P and the terminating resistor TR. The energy storage control circuit SDC, the terminating resistor TR, and the terminating switch TSW shown in FIG. 11 can be analogized with reference to the related description of FIG. 2 to FIG. 9, which is not repeated herein.

Based on the above, the energy storage control circuit SDC according to the embodiments of the invention can store the charge of the CC pin P to obtain the stored electrical energy. During the configuration detection period, the energy storage control circuit SDC can turn on the terminating switch TSW by using the stored electrical energy, so the external device (not shown, for example, the power source device) can detect the voltage level of the CC pin P (i.e., perform the configuration detection). The terminating switch TSW is turned on by using the stored charge of the CC pin P, so that the selection of the terminating switch is not limited to the low-voltage elements. After the configuration detection period is ended, the energy storage control circuit SDC can continuously turn off the terminating switch TSW to effectively reduce the power consumption of the terminating resistor TR during the non-configuration detection period.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A terminating resistor circuit of a USB port, comprising:

a terminating resistor;

a terminating switch, wherein the terminating resistor and the terminating switch are connected in series between a configuration channel pin of the USB port and a first reference voltage; and an energy storage control circuit, coupled to a control end of the terminating switch, wherein during a charging period in a configuration detection period, the energy storage control circuit stores charge from the configuration channel pin to obtain a stored electrical energy, and during a discharging period in the configuration detection period, the energy storage control circuit turns on the terminating switch by using the stored electrical energy, wherein the energy storage control circuit comprises:

a capacitor; and a control circuit, coupled to the control end of the terminating switch and the capacitor, wherein during the charging period, the control circuit transmits the charge from the configuration channel pin to the capacitor, and the control circuit turns off the terminating switch, and during the discharging period, the control circuit turns on the terminating switch by using the stored electrical energy stored in the capacitor.

2. The terminating resistor circuit according to claim 1, wherein after an external device electrically connected to the USB port completes a configuration detection, the configuration detection period is ended and a non-configuration detection period is entered.

3. The terminating resistor circuit according to claim 1, wherein the control circuit comprises:

a first switch, comprising a first end and a second end respectively coupled to the configuration channel pin and the capacitor;

a second switch, comprising a first end and a second end respectively coupled to the capacitor and the control end of the terminating switch; and a voltage detection circuit, coupled to the capacitor, a control end of the first switch, and a control end of the second switch, wherein when a voltage of the capacitor is greater than a first threshold, the voltage detection circuit turns off the first switch and turns on the second switch such that the stored electrical energy stored in the capacitor turns on the terminating switch, and when the voltage of the capacitor is less than a second threshold, the voltage detection circuit turns on the first switch and turns off the second switch such that the charge from the configuration channel pin charges the capacitor.

4. The terminating resistor circuit according to claim 3, wherein the control circuit further comprises:

a third switch, comprising a control end, a first end, and a second end respectively coupled to the voltage detection circuit, a second reference voltage, and the control end of the terminating switch, wherein when the voltage of the capacitor is greater than the first threshold, the voltage detection circuit further turns off the third switch, and when the voltage of the capacitor is less than the second threshold, the voltage detection circuit further turns on the third switch such that the second reference voltage turns off the terminating switch.

5. The terminating resistor circuit according to claim 3, wherein the second threshold is less than the first threshold.

6. The terminating resistor circuit according to claim 1, wherein a first end of the terminating resistor is coupled to the configuration channel pin, a second end of the terminating resistor is coupled to a first end of the terminating switch, and a second end of the terminating switch is coupled to the first reference voltage.

7. The terminating resistor circuit according to claim 6, wherein the energy storage control circuit is coupled to the configuration channel pin via the terminating resistor to receive and store the charge of the configuration channel pin.

8. The terminating resistor circuit according to claim 1, wherein a first end of the terminating switch is coupled to the configuration channel pin, a second end of the terminating switch is coupled to a first end of the terminating resistor, and a second end of the terminating resistor is coupled to the first reference voltage.

9. The terminating resistor circuit according to claim 1, wherein the energy storage control circuit is controlled by a control signal, and when the control signal indicates a non-configuration detection period, the energy storage control circuit turns off the terminating switch.

10. An operation method of a terminating resistor circuit of a USB port, the terminating resistor circuit comprising a terminating resistor and a terminating switch, and the terminating resistor and the terminating switch being connected in series between a configuration channel pin of the USB port and a first reference voltage, the operation method comprising:

during a charging period in a configuration detection period, storing charge from the configuration channel pin by an energy storage control circuit to obtain a stored electrical energy; and during a discharging period in the configuration detection period, turning on the terminating switch by the energy storage control circuit by using the stored electrical energy, wherein during the charging period, transmitting the charge from the configuration channel pin to a capacitor by a control circuit, and turning off the terminating switch by the control circuit, and wherein during the discharging period, turning on the terminating switch by the control circuit by using the stored electrical energy stored in the capacitor.

11. The operation method according to claim 10, wherein after an external device electrically connected to the USB port completes a configuration detection, the configuration detection period is ended and a non-configuration detection period is entered.

12. The operation method according to claim 10, further comprising:

comparing a voltage of the capacitor, a first threshold, and a second threshold by a voltage detection circuit;

when the voltage of the capacitor is greater than the first threshold, turning off a first switch and turning on a second switch by the voltage detection circuit such that the stored electrical energy stored in the capacitor turns on the terminating switch, wherein a first end and a second end of the first switch are respectively coupled to the configuration channel pin and the capacitor, and a first end and a second end of the second switch are respectively coupled to the capacitor and a control end of the terminating switch; and when the voltage of the capacitor is less than the second threshold, turning on the first switch and turning off the second switch by the voltage detection circuit such that the charge from the configuration channel pin charges the capacitor.

13. The operation method according to claim 12, further comprising:

when the voltage of the capacitor is greater than the first threshold, further turning off a third switch by the voltage detection circuit, wherein a control end, a first end, and a second end of the third switch are respectively coupled to the voltage detection circuit, a second reference voltage, and the control end of the terminating switch; and when the voltage of the capacitor is less than the second threshold, further turning on the third switch by the voltage detection circuit such that the second reference voltage turns off the terminating switch.

14. The operation method according to claim 12, wherein the second threshold is less than the first threshold.

15. The operation method according to claim 10, wherein a first end of the terminating resistor is coupled to the configuration channel pin, a second end of the terminating resistor is coupled to a first end of the terminating switch, and a second end of the terminating switch is coupled to the first reference voltage.

16. The operation method according to claim 15, wherein the energy storage control circuit is coupled to the configuration channel pin via the terminating resistor to receive and store the charge of the configuration channel pin.

17. The operation method according to claim 10, wherein a first end of the terminating switch is coupled to the configuration channel pin, a second end of the terminating switch is coupled to a first end of the terminating resistor, and a second end of the terminating resistor is coupled to the first reference voltage.

18. The operation method according to claim 10, further comprising:

controlling the energy storage control circuit by a control signal; and when the control signal indicates a non-configuration detection period, turning off the terminating switch by the energy storage control circuit.

19. A terminating resistor circuit of a USB port, comprising:

a terminating switch; and a terminating resistor, wherein the terminating resistor and the terminating switch are connected in series between a configuration channel pin of the USB port and a first reference voltage, wherein during a configuration detection period, the configuration channel pin receives a detection current;

during a charging period in the configuration detection period, the terminating switch is turned off, and a capacitor stores charge from the configuration channel pin to obtain a stored electrical energy such that a voltage of the configuration channel pin is pulled up during the charging period;

after the charging period is ended, a discharging period in the configuration detection period is entered;

during the discharging period, the terminating switch is turned on by using the stored electrical energy of the capacitor such that the voltage of the configuration channel pin is pulled down during the discharging period; and after the discharging period is ended, the charging period is entered again unless the configuration detection period is ended.

20. The terminating resistor circuit according to claim 19, wherein when the voltage of the capacitor is greater than a first threshold, the charging period is ended and the discharging period is entered; and when the voltage of the capacitor is less than a second threshold, the discharging period is ended and the charging period is entered.

21. The terminating resistor circuit according to claim 20, wherein the second threshold is less than the first threshold.

22. An operation method of a terminating resistor circuit of a USB port, the terminating resistor circuit comprising a terminating resistor and a terminating switch, and the terminating resistor and the terminating switch being connected in series between a configuration channel pin of the USB port and a first reference voltage, the operation method comprising:

during a configuration detection period, receiving a detection current by the configuration channel pin of the USB port;

during a charging period in the configuration detection period, turning off the terminating switch, and storing charge from the configuration channel pin by a capacitor to obtain a stored electrical energy such that a voltage of the configuration channel pin is pulled up during the charging period;

after the charging period is ended, entering a discharging period in the configuration detection period;

during the discharging period, turning on the terminating switch by using the stored electrical energy of the capacitor such that the voltage of the configuration channel pin is pulled down during the discharging period; and after the discharging period is ended, entering the charging period again unless the configuration detection period is ended.

23. The operation method according to claim 22, further comprising:

when the voltage of the capacitor is greater than a first threshold, ending the charging period and entering the discharging period; and when the voltage of the capacitor is less than a second threshold, ending the discharging period and entering the charging period.

24. The operation method according to claim 23, wherein the second threshold is less than the first threshold.

* * * * *